United States Patent [19]

Ishida et al.

[11] Patent Number: 5,614,024
[45] Date of Patent: Mar. 25, 1997

[54] APPARATUS FOR APPLYING PASTE

[75] Inventors: Shigeru Ishida, Ibaraki-ken; Satoshi Yawata, Kashiwa; Tomio Yoneda, Ibaraki-ken; Haruo Mishina, Ushiku; Kiyoshi Imaizumi; Yukihiro Kawasumi, both of Ryugasaki, all of Japan

[73] Assignee: Hitachi Techno Engineering Co., Ltd., Tokyo, Japan

[21] Appl. No.: 281,001

[22] Filed: Jul. 27, 1994

[30] Foreign Application Priority Data

Aug. 6, 1993 [JP] Japan .................. 5-196244
Nov. 10, 1993 [JP] Japan .................. 5-281232

[51] Int. Cl.⁶ .................................. B05C 11/00
[52] U.S. Cl. .................. 118/712; 118/697; 118/706
[58] Field of Search .................. 118/698, 706, 118/712, 700, 713, 714, 668, 669, 676, 680, 679, 696, 300, 323, 697

[56] References Cited

U.S. PATENT DOCUMENTS 4,919,967  4/1990  Handke et al. .................. 427/8
5,052,338  10/1991 Maiorca et al. .................. 118/668
5,387,288  2/1995  Shatas .......................... 118/723 AN
5,437,727  8/1995  Yoneda et al. .................. 118/669

FOREIGN PATENT DOCUMENTS 2-52742  2/1990  Japan.

Primary Examiner—Donald E. Czaja
Assistant Examiner—Calvin Padgett
Attorney, Agent, or Firm—Antonelli, Terry, Stout & Kraus, LLP

[57] ABSTRACT

An apparatus for applying a paste to a surface of a substrate by holding the substrate on a table and by moving a nozzle relative to the table to form a desired paste pattern on the substrate. The apparatus has a device for measuring the position of a paste ejection orifice of the nozzle, a processing unit for calculating, from a result of the measurement by the measuring device, a displacement of the position of the paste ejection orifice when the nozzle is changed, and a mechanism for positioning the substrate at a desired position with respect to the ejection orifice of the changed nozzle on the basis of a result of the operation of the processsing unit. With this arrangement, even if the position of the ejection orifice of the nozzle is changed when the nozzle is changed, the desired positional relationship between the nozzle and the substrate can be set with improved accuracy, whereby a paste pattern can be drawn accurately.

10 Claims, 11 Drawing Sheets

APPARATUS FOR APPLYING PASTE

BACKGROUND OF THE INVENTION

1. Field of the Invention

This invention relates to an apparatus for applying a paste to a surface of a substrate placed on a table to draw a predetermined paste pattern on the substrate and, more particularly, to a paste applying apparatus designed so that a paste container having a nozzle fixed to its lower end is exchangeable.

2. Description of the Related Art

In apparatus for applying a paste in accordance with an ejection drawing art, a substrate placed on a table is opposed to a nozzle fixed to an end of a paste container filled with a paste, and the paste is applied to the substrate to form a desired paste pattern by moving at least one of the nozzle and the table so that the positions of the nozzle and the table are changed relative to each other while the paste is being ejected. An apparatus of this kind, e.g., the one disclosed in Japanese Unexamined Patent Publication No. 2-52742, is known in which a resistor paste is ejected onto an insulating substrate from a paste ejection orifice formed in an nozzle end portion so that a resistor paste pattern of a desired shape is formed on the insulating substrate.

In such a conventional paste applying apparatus, it is possible that the paste contained in a paste containing cylinder will be consumed for pattern drawing on one substrate to such an extent that refill of the paste is needed during pattern drawing on the next substrate. In such a case, the paste containing cylinder may be refilled with the paste before drawing on the next substrate. The operation of refilling the paste container in such a situation entails a problem in view of precision machine arrangement. Therefore, it is a common practice to design a paste applying apparatus such that a used paste container cylinder can be replaced with a new container cylinder filled with the paste. In such an apparatus, a nozzle is integrally combined with the paste container cylinder and changed together with the cylinder. "Nozzle change" hereinafter referred to denotes such a change.

In general, if there are some deviations of the accuracy of working the paste container cylinders and the nozzle and the accuracy of mounting these components, the position of the nozzle-tip ejection orifice is varied when the nozzle is changed for the above-mentioned purpose, resulting in failure to correctly draw a desired paste pattern at a predetermined position on a substrate.

That is, if the position of the nozzle-tip ejection orifice is varied by a nozzle change during pattern drawing, the position of a terminal end of a pattern formed before the nozzle change and the position of a starting end of a pattern formed after the nozzle change do not coincide with each other. This leads to a serious problem if the paste pattern to be formed is thinner.

For example, in the case of a resistor pattern, pattern portions before and after a nozzle change may overlap each other at the joint position or may be offset from each other in a widthwise direction so that the entire pattern has a cranked shape. In such a case, a variation is caused in the resistance per unit length of the resistor pattern. In particular, if a gap is formed at a joint between pattern portions before and after a nozzle change, there is a possibility of in the resistor pattern. In the case of a break applying a sealing material so as to draw a seal pattern for a liquid crystal display device, there is a risk of discontinuity of the sealing member and, hence, failure to sealingly enclose a liquid crystal.

Further, in a case where identical paste patterns are to be formed on a plurality of substrates, the paste patterns must be formed on the same positions on the substrates. However, if there is a change in the position of the nozzle-end ejection orifice due to a nozzle change, as described above, the positions of paste pattern portions formed before and after the nozzle change are offset from each other to impair the product value. For example, if there is a misalignment in sealing material patterns formed on liquid crystal enclosing substrates for a liquid crystal display device, some display pixel portions may be located outside the pattern when the substrates are superposed, so that the resulting display device cannot correctly display information.

SUMMARY OF THE INVENTION

In view of this problem, an object of the present invention is to provide a paste applying apparatus which can apply and draw a paste pattern having a desired shape with improved accuracy even if the positional relationship between the substrate and the nozzle ejection orifice is changed by a nozzle change.

Another object of the present invention is to provide a paste applying apparatus designed to prevent a misalignment between a terminal end position of a pattern formed before a nozzle change and a starting end position of a pattern formed after the nozzle change, and to achieve accurate application drawing free from occurrence of an overlap of joint portions of patterns obtained before and after a nozzle change and also free from a cranked pattern joint caused by a shift in a widthwise direction of the patterns.

Still another object of the present invention is to provide a paste applying apparatus free from occurrence of a gap at a joint between patterns drawn before and after a nozzle change and characterized by having an improved paste forming accuracy.

A further object of the present invention is to provide a paste applying apparatus capable of performing accurate application drawing and constantly maintaining the position of a paste pattern even if the nozzle is changed in a process of forming identical paste patterns on a plurality of substrates.

To achieve these objects, according to the present invention, there is provided an apparatus for applying a paste onto a substrate, comprising measurement means for measuring the position of a paste ejection orifice of a nozzle when the nozzle is changed, calculation means for calculating an offset or misalignment of the paste ejection orifice of the nozzle, and adjustment means for adjusting the position of the substrate according to the nozzle offset calculated by the calculation means.

The apparatus may also comprise memory means for storing information of the fact that the nozzle has been changed. The measurement, calculation and adjustment means are operated based on this information.

If the nozzle is changed, the position of the paste ejection orifice of the nozzle is measured by the measurement means. The offset or misalignment between the nozzles before and after the nozzle change is detected by the calculation means based on the result of this measurement. The position of the substrate with respect to the nozzle is adjusted on the basis of the detected misalignment by the adjustment means. The ejection orifice position after the nozzle change is thereby moved to the ejection orifice position before the nozzle change so that the positional relationship between the nozzle and the measurement point of the measurement means after the nozzle change becomes equivalent to that before the nozzle change, thereby cancelling the nozzle misalignment between the nozzles before and after the nozzle change. Therefore, the paste can be applied in the same condition as before the nozzle change, and pattern drawing can be performed while avoiding the above-mentioned problems of breaking, overlapping, cranking and the like.

Alternatively, the position of a substrate positioning camera relative to the nozzle may be changed by the adjustment means on the basis of the misalignment obtained by the calculation means.

If the nozzle is changed, information indicating that the nozzle has been changed is stored in the memory means. In a case where the same paste pattern is drawn on a plurality of substrates, even if the nozzle is changed during drawing, the fact that the nozzle is changed can be recognized from the information stored in the memory means. The arrangement may be such that, when this information can be read from the memory means, the nozzle position misalignment measurement and the adjustment movement of the substrate or the substrate positioning camera, described above, are automatically performed, thereby enabling the pattern to be drawn from the same position on the plurality of substrates.

DESCRIPTION OF THE PREFERRED EMBODIMENT

An embodiment of the present invention will be described below with reference to the accompanying drawings.

Figure 1:
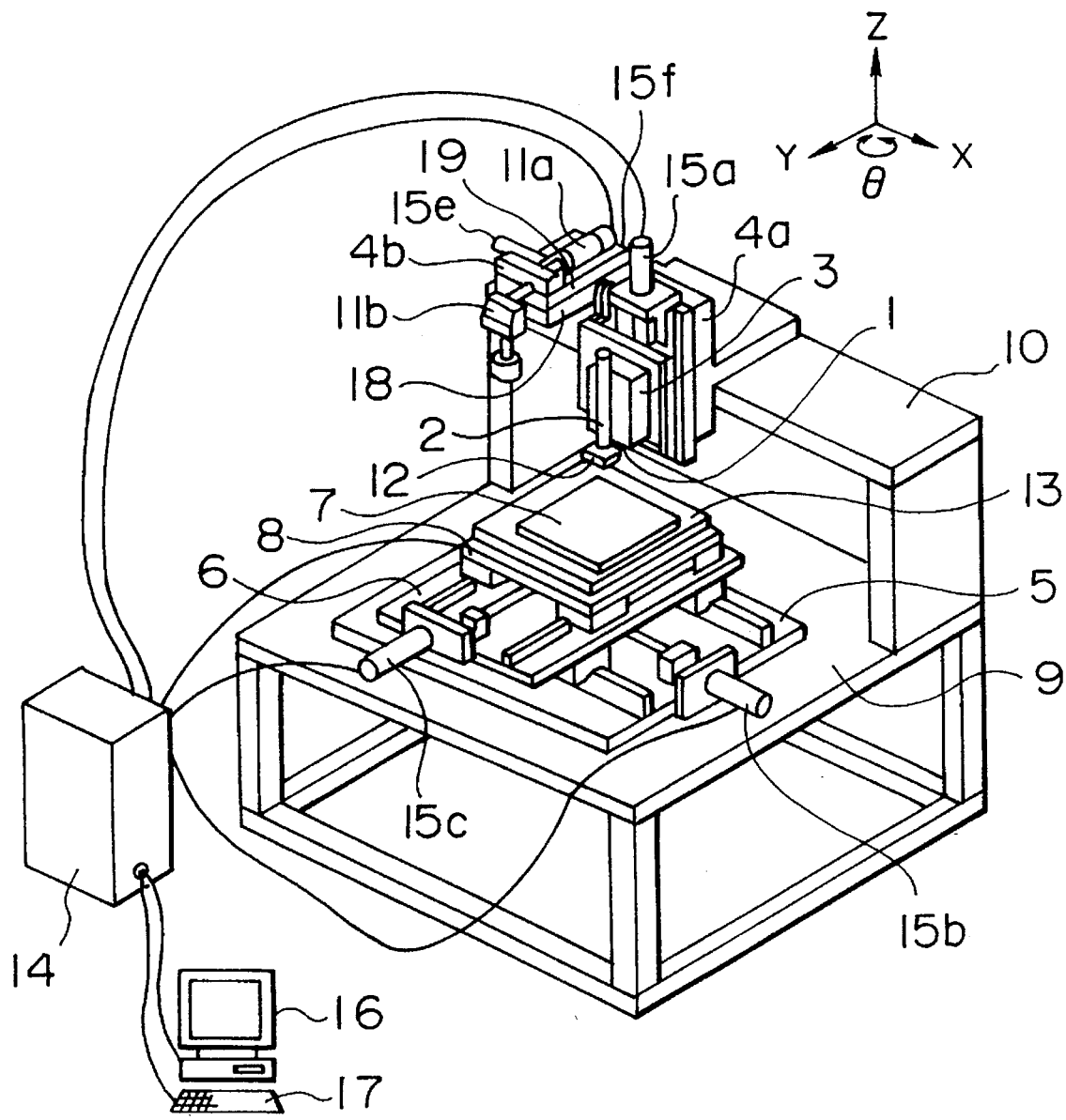
FIG. 1 is a schematic perspective view of an embodiment of a paste applying apparatus in accordance with the present invention.

FIG. 1 is a schematic perspective view of an embodiment of an apparatus for applying a paste in accordance with the present invention. FIG. 1 shows a nozzle 1, a paste container cylinder 2, an optical distance measuring device 3, a Z-axis table 4a, a camera supporting portion 4b, an X-axis table 5, a Y-axis table 6, a substrate 7, a θ-axis table 8, a supporting frame 9, a Z-axis table supporting member 10, a camera 11a for image recognition and also for positioning a substrate, a lens barrel 11b of the image recognition camera 11a, a nozzle supporting member 12, an attracting base 13, a control unit 14, servo motors 15a, 15b, 15c, 15e and 15f, a monitor 16, a keyboard 17, an X-axis table 18 for moving the camera, and a Y-axis table 19 for moving the camera.

As shown in FIG. 1, the X-axis table 5 is fixed on the supporting frame 9 and the Y-axis table 6 is mounted on the X-axis table 5 so as to be movable along Y-axis. The θ-axis table 8 on which an attracting base 13 is fixed is mounted on the Y-axis table 6 so as to be movable along Y-axis. The substrate 7 is attracted to and mounted on the attracting base 13 so that its two adjacent sides are, for example, parallel to X-and Y-axes. The substrate 7, mounted on the attracting base 13, can be moved along each of X-and Y-axes by a control and drive operation of the control unit 14. That is, when the servo motor 15b is driven by the control unit 14, the X-axis table 5 is moved along X-axis to move the substrate 7 along X-axis. When the servo motor 15c is driven, the Y-axis table 6 is moved along Y-axis to move the substrate 7 along Y-axis. Accordingly, the control unit 14 moves the X-axis table 5 and the Y-axis table 6 by selected distances to move the substrate 7 to any position and in any direction within a certain range along a plane parallel to the supporting surface of the supporting frame 9. The θ-axis table 8 is rotatable in a θ-direction about its center axis by a servo motor (not shown).

The Z-axis table supporting member 10 is provided on the supporting frame 9 and the Z-axis table 4a is mounted on the Z-axis table 4a so as to be movable along Z-axis (vertical direction). The nozzle 1, the paste container cylinder 2 and the optical distance measuring device 3 are mounted on the Z-axis table 4a. The control unit 14 also controls and drives the Z-axis table 4a along the Z-axis (vertical direction). That is, when the control unit 14 drives the servo motor 15a, the Z-axis table 4a is moved along Z-axis. With this movement, the nozzle 1, the paste container cylinder 2 and the optical distance measuring device 3 are moved along the Z-axis. The nozzle 1 is provided at an extreme end portion of the paste container cylinder 2 and is slightly spaced apart from the lower end (extreme end) of the cylinder 2 by a nozzle supporting member 12 having a communication portion.

The optical distance measuring device 3 serves to measure the distance between a paste ejection orifice formed in the extreme end (lower end) of the nozzle 1 and the upper surface of the substrate 7 in a non-contact trigonometric manner.

Figure 2:
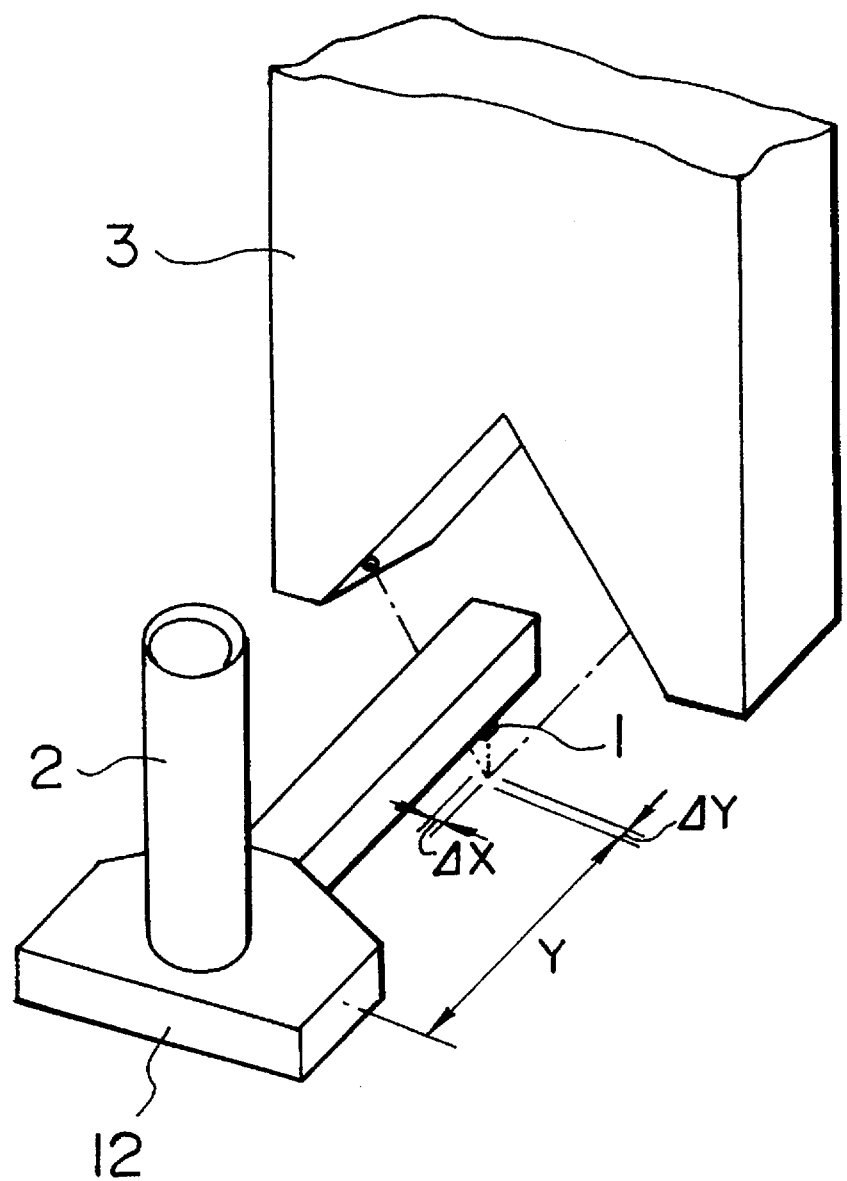
FIG. 2 is a perspective view showing the positional relationship between a paste container cylinder, a nozzle and an optical distance measuring device of the embodiment shown in FIG. 1.

More specifically, as shown in FIG. 2, a lower end portion of the optical distance measuring device 3 has a triangular notch and a light emitting element is provided on one side surface of the notch while a light receiving element is provided on the other side surface thereof. The nozzle supporting member 12 is attached to the extreme end of the paste container cylinder 2 and has a portion extending to a position below the notch in the optical distance measuring device 3. The nozzle 1 is attached to a lower surface of an extreme end portion of the nozzle supporting member 12. The light emitting element provided on the notch in the optical distance measuring device 3 irradiates the substrate 7 (FIG. 1) below the nozzle 1, as indicated by a dot-dash line in FIG. 2 and the light receiving element receives the light reflected from this portion of the substrate. The positional relationship between the nozzle 1 and the optical distance measuring device 3 and the positions of the light emitting element and the light receiving element on the optical distance measuring device 3 are set so that light from the light emitting element travels to a surface portion of the substrate 7 immediately under the nozzle 1 when the distance between the paste ejection orifice in the extreme end of the nozzle 1 and the upper surface of the substrate 7 is correctly set. Therefore, if the distance between the paste ejection orifice of the nozzle 1 and the substrate 7 is changed, the point at which the substrate 7 is irradiated with light from the light emitting element is shifted from the position directly under the nozzle 1, thereby changing a light receiving condition of the light receiving element. From this change, the distance between the paste ejection orifice of the nozzle 1 and the substrate 7 can be measured.

As described later, when a paste pattern is formed by moving the substrate 7 along X-and Y-axes, the point of irradiation of the substrate with light from the light emitting element (this point is hereinafter referred to as "measuring point") may move across the paste pattern already formed. In such a situation, an error is caused in the measured value of the distance between the paste ejection orifice of the nozzle 1 and the surface of the substrate 7 by the thickness of the paste pattern. To minimize the possibility of the measuring point moving across paste patterns, it is preferred that the measuring point will be offset obliquely with respect to X-and Y-axes from the point on the substrate 7 to which the paste is applied dropwise from the nozzle 1 (this point is hereinafter referred to as "application point").

When the paste in the paste container cylinder is used up, the nozzle is changed, as mentioned above, and a new nozzle 1 is attached so that the application point coincides with a set point on the substrate 7 to which the paste is to be applied. It is possible that the positions of the two nozzles 1 before and after the change will be different from each other because of deviation of accuracy of each of the paste container cylinder 2, the nozzle supporting member 12 and the nozzle 1. However, it is considered that the nozzle 1 is attached normally if the application point falls within predetermined allowable ranges of ΔX and ΔY about the set position, as shown in FIG. 2, where ΔX is a distance along X-axis while ΔY is a distance along Y-axis.

Referring back to FIG. 1, the camera moving X-axis table 18 is fixed to the Z-axis table supporting member 10 and the camera moving Y-axis table 19 is mounted on the camera moving X-axis table 18 so as to be movable along X-axis. The camera supporting portion 4b is mounted on the camera moving Y-axis table 19 so as to be movable along Y-axis. The image recognition camera 11a to which the lens barrel 11b is attached is mounted on the camera supporting portion 4b.

The image recognition camera 11a can be moved along X-and Y-axes by controlling and driving of the control unit 14. That is, when the servo motor 15e is driven by the control unit 14, the camera moving X-axis table 18 moves along X-axis to move the image recognition camera 11a along X-axis. When the servo motor 15f is driven, the camera moving Y-axis table 19 moves along Y-axis to move the image recognition camera 11a along Y-axis. Accordingly, the control unit 14 moves the camera moving X-axis table 18 and the camera moving Y-axis table 19 by selected distances to move the image recognition camera 11a to any position and in any direction within a certain range along a plane parallel to the substrate 7.

The control unit 14 is supplied with data from the optical distance measuring device 3 and the image recognition camera 11a to drive the servo motors 15a, 15b, 15c, 15e and 15f and a servo motor 15d (shown in FIG. 3) for moving the θ-axis table 8 according to the supplied data. Also, data on the driving condition of each motor is fed back to the control unit 14 from an encoder (represented by symbol "E" in FIG. 3) provided for the motor.

In the monitor 16, various kinds of data, such as an image of the substrate 7 taken by the image recognition camera 11a, data input from the keyboard 17, data on the processing conditions obtained from the control unit 14, etc. are displayed on the screen.

In the apparatus thus arranged, when the substrate 7 having rectangular shape is placed on the attracting base 13, the substrate 7 is fixed to the attracting base 13 by vacuum attraction. The θ-axis table 8 is then operated to set the sides of the substrate 7 parallel to X-and Y-axes. Then, the servo motor 15a is driven and controlled on the basis of the result of measurement performed by the optical distance measuring device 3 to move the Z-axis table 4a downward, thereby causing a downward movement of the nozzle 1 toward the substrate 7. This downward movement is stopped when the distance between the paste ejection orifice of the nozzle 1 and the surface of the substrate 7 becomes equal to a predetermined distance.

Thereafter, the paste supplied from the paste container cylinder 2 and through the nozzle supporting member 12 is ejected from the nozzle 1, and the X-axis and Y-axis tables 5 and 6 are suitably moved while they are driven and controlled by the servo motors 15b and 15c. The paste is thereby applied so as to form a paste pattern of a desired shape on the substrate 7. The paste pattern to be formed can be calculated in terms of distances in X-axis and X-axis directions to obtain paste pattern data. When such paste pattern data is input from the keyboard 17, the control unit 14 provides a drive command by converting this data into pulses applied to the servo motors 15b and 15c, thereby enabling the drawing operation to be performed automatically.

Figure 3:
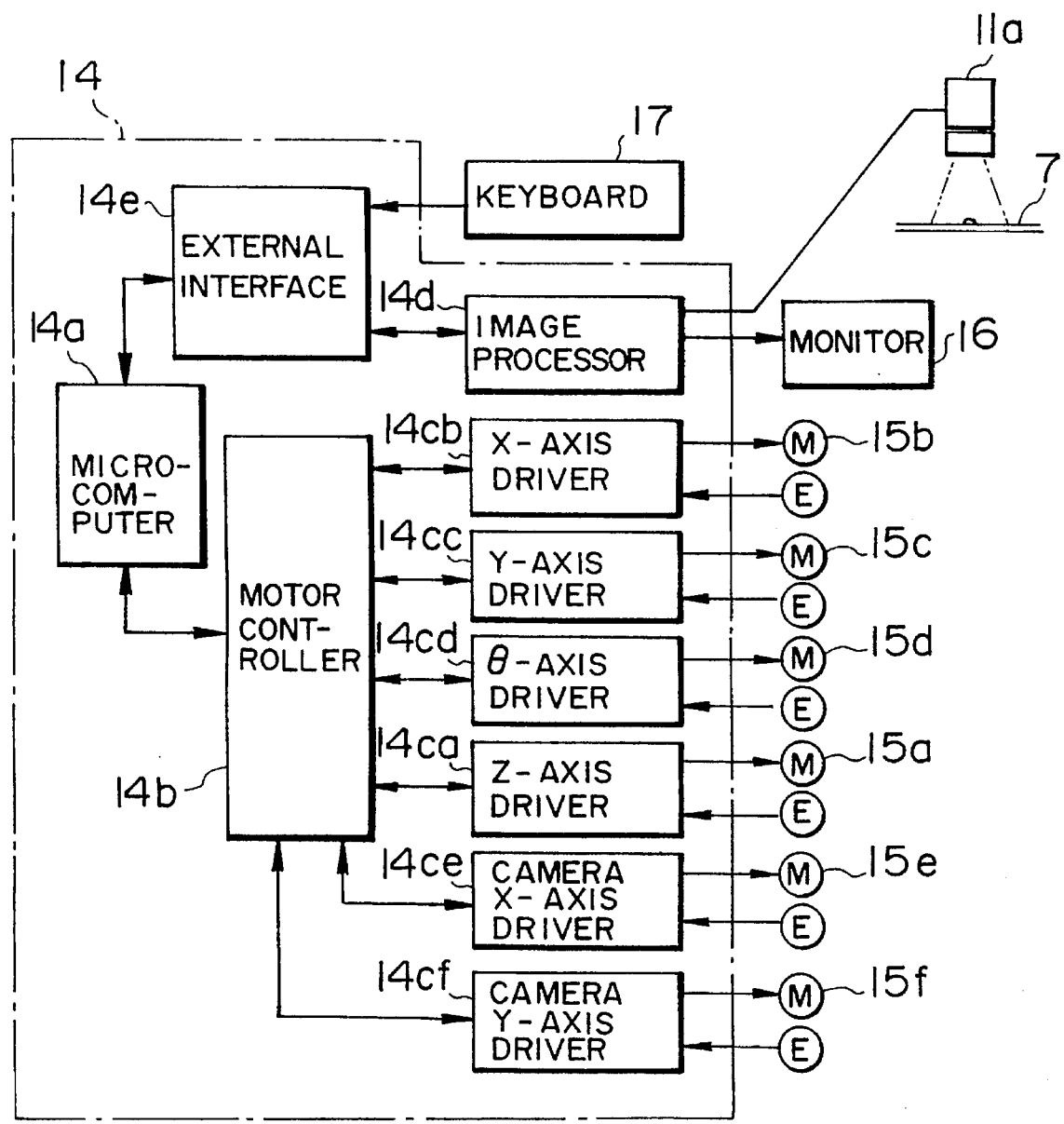
FIG. 3 is a block diagram of an example of a control unit shown in FIG. 1.

FIG. 3 is a block diagram of an example of the control unit 14 shown in FIG. 1 and includes a microcomputer 14a, a motor controller 14b, a Z-axis driver 14ca, an X-axis driver 14cb, a Y-axis driver 14cc, a θ-axis driver 14cd, a camera moving X-axis driver 14ce, a camera moving Y-axis driver 14cf, an image processor 14d, an external interface 14e, the servo motor 15d for moving the θ-axis table 8 shown in FIG. 1, and encoders E. In FIG. 3, the components corresponding to those shown in FIG. 1 are indicated by the same reference characters.

More specifically, as illustrated, the control unit 14 has the microcomputer 14a incorporating a ROM for storing a processing program, a RAM for storing various kinds of data, a CPU for calculation of various kinds of data, the motor controller 14b for controlling the servo motors 15a to 15f, the drivers 14ca to 14cf for driving the servo motors 15a to 15f, the image processor 14d for processing images taken by the image recognition camera 11a, and the external interface 14e to which the keyboard 17 and the image processor 14d are connected.

Various kinds of data from the keyboard 17, which designate a paste drawing pattern, a nozzle change and the like, and various kinds of data formed by the processing operation of the microcomputer 14a are stored in the RAM incorporated in the microcomputer 14a.

Next, the processing operation of the control unit 14 will be described in respect of paste application drawing and a nozzle change.

Figure 5:
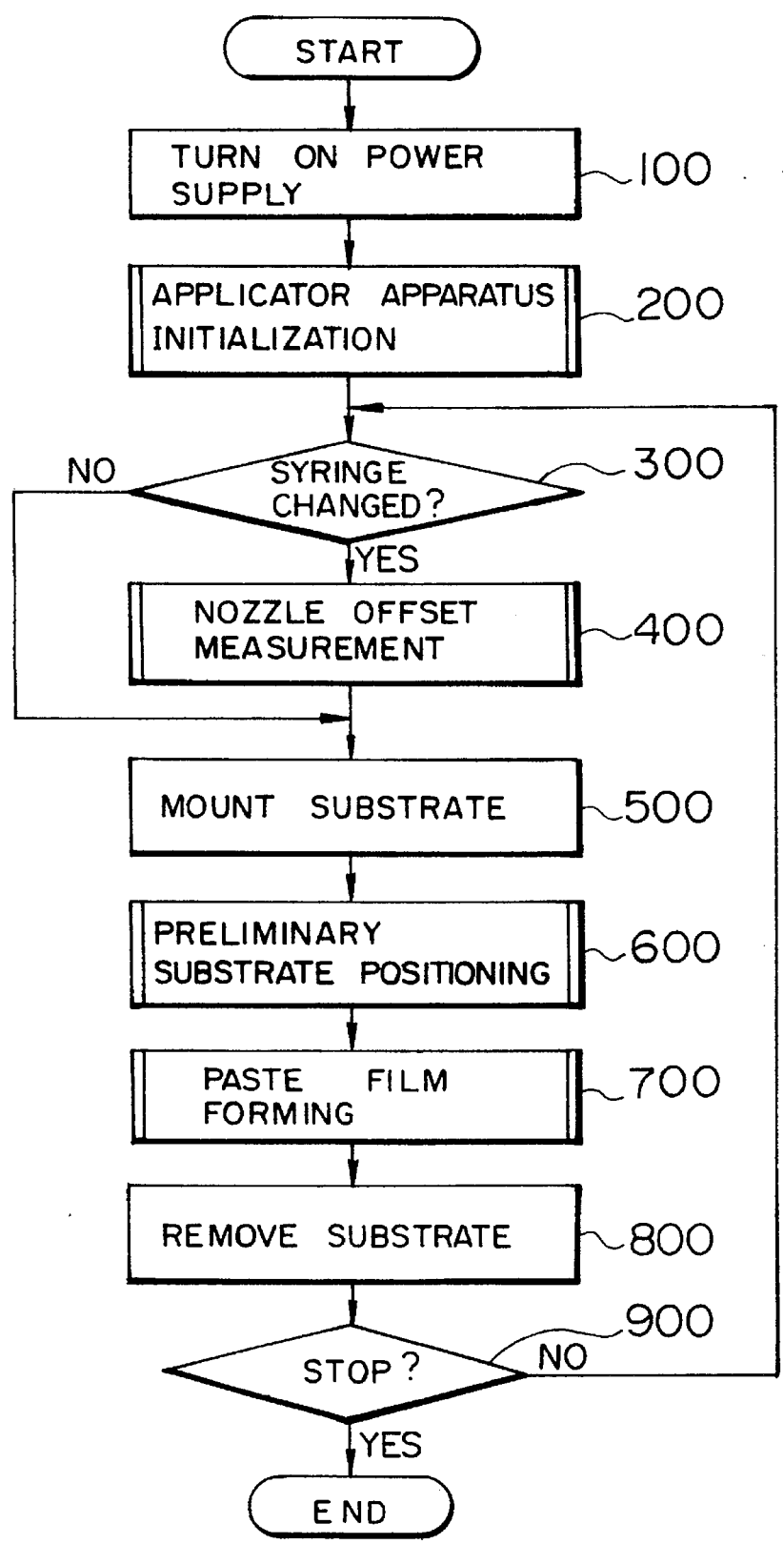
FIG. 5 is a flowchart of the overall operation of the embodiment shown in FIG. 1.
Figure 6:
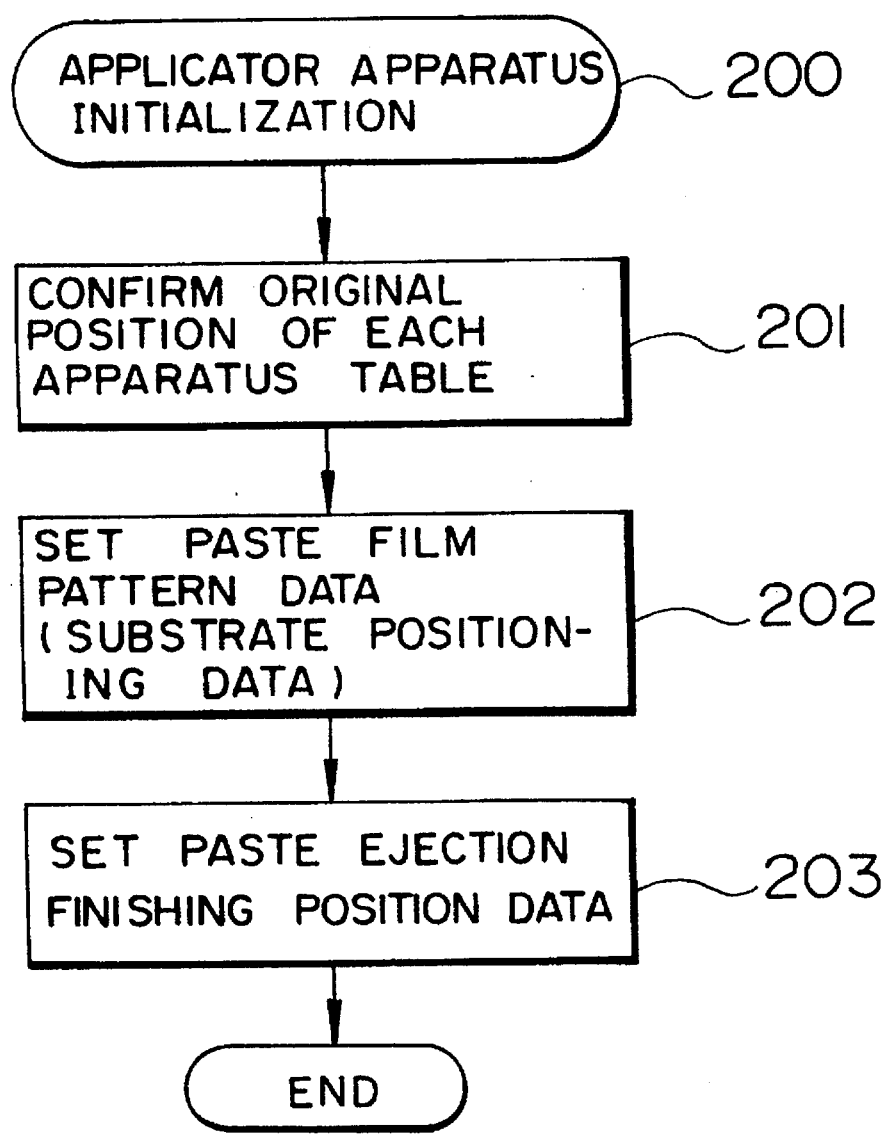
FIG. 6 is a flowchart showing details of an application initialization step shown in FIG. 5.

Referring to FIG. 5, when the power supply is turned on (step 100), initialization of the paste applying apparatus is executed (step 200). As shown in FIG. 6, in this initialization, the Z-axis table 4a, the X-axis table 5 and the Y-axis table 6 are positioned at predetermined original positions (step 201), data on a paste pattern and data on the position of the substrate 7 are set (step 202), and data on a position at which paste ejection is terminated is set (step 203). Inputting these kinds of data to be set is performed through the keyboard 17. The data thus input are stored in the RAM incorporated in the microcomputer 14a, as mentioned above.

Referring back to FIG. 5, after the initialization, a determination is made as to whether the nozzle has been changed (step 300). Changing of the nozzle will be described later in detail with respect to a paste film forming sub process (step 700) shown in FIG. 9. If the nozzle has been changed, a nozzle offset or misalignment measuring sub process (step 400) is performed. If the nozzle has not been changed, the main process advances to step 500. The process of step 400 will be described below in detail with reference to FIG. 7.

Figure 7:
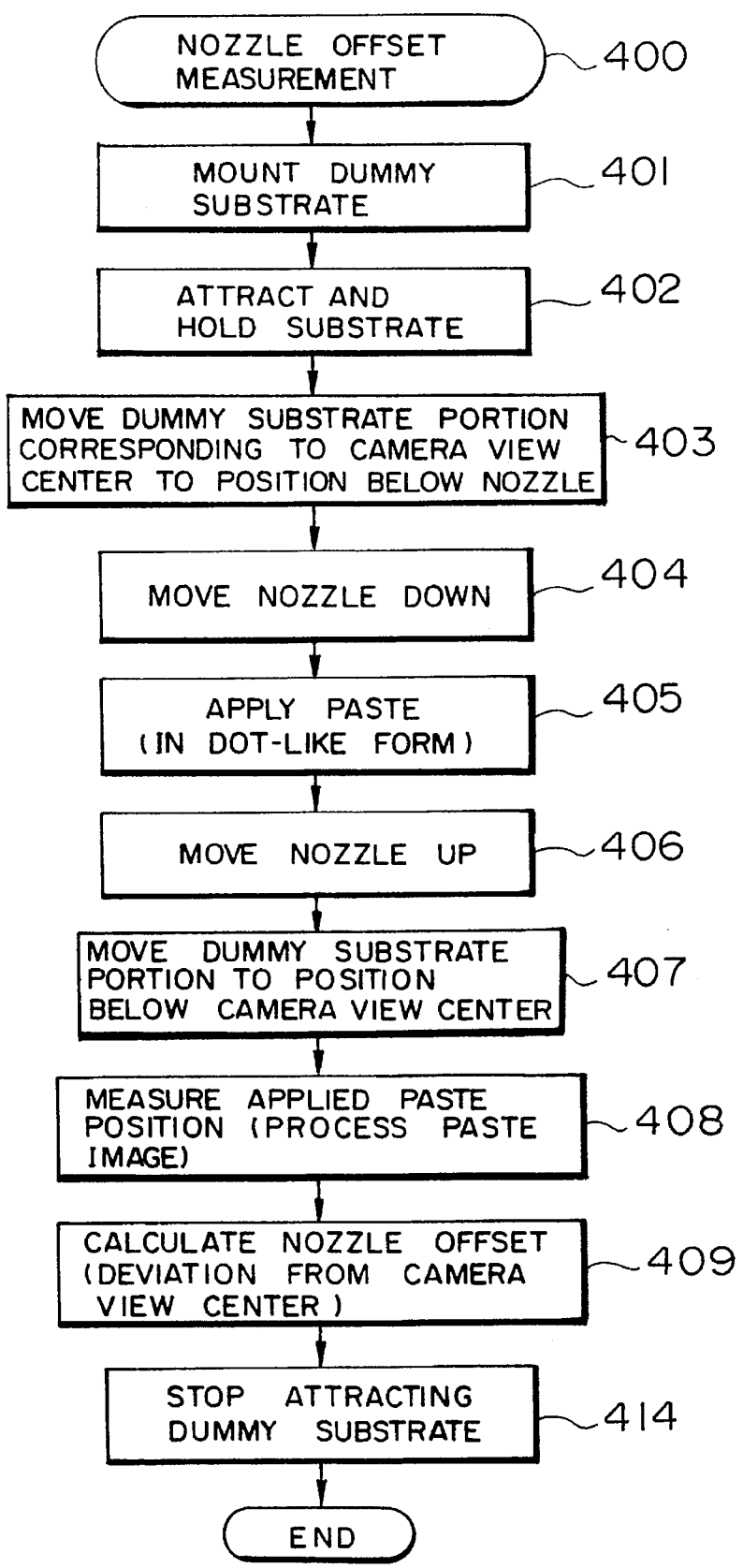
FIG. 7 is a flowchart showing details of a nozzle misalignment measuring step shown in FIG. 5.

Referring to FIG. 7, a dummy substrate is first placed on the attracting base 13 shown in FIG. 1 (step 401) and is then attracted to and supported on the attracting base 13 (step 402), and the dummy substrate is shifted so that its portion located at a center of the field of view of the image recognition camera 11a is moved to a position directly under the nozzle 1 (step 403). Then, the Z-axis table 4a is moved downward for a downward movement of the nozzle 1 (step 404), and the paste contained in the paste container cylinder 2 is ejected dropwise through the paste ejection orifice of the nozzle 1, thereby forming a dot-like paste film on the dummy substrate (step 405). Thereafter, the nozzle 1 is moved upward (step 406) and the dummy substrate is shifted to the position under the center of the field of view of the image recognition camera 11a (step 407). Then, the dot-like paste film is imaged by the image recognition camera 11a, and an output from the camera is processed by the image processor 14d (FIG. 3) in a well-known image processing manner to obtain a centroid of the dot-like paste film (i.e., the position of a center of the dot) (step 408).

Figure 4:
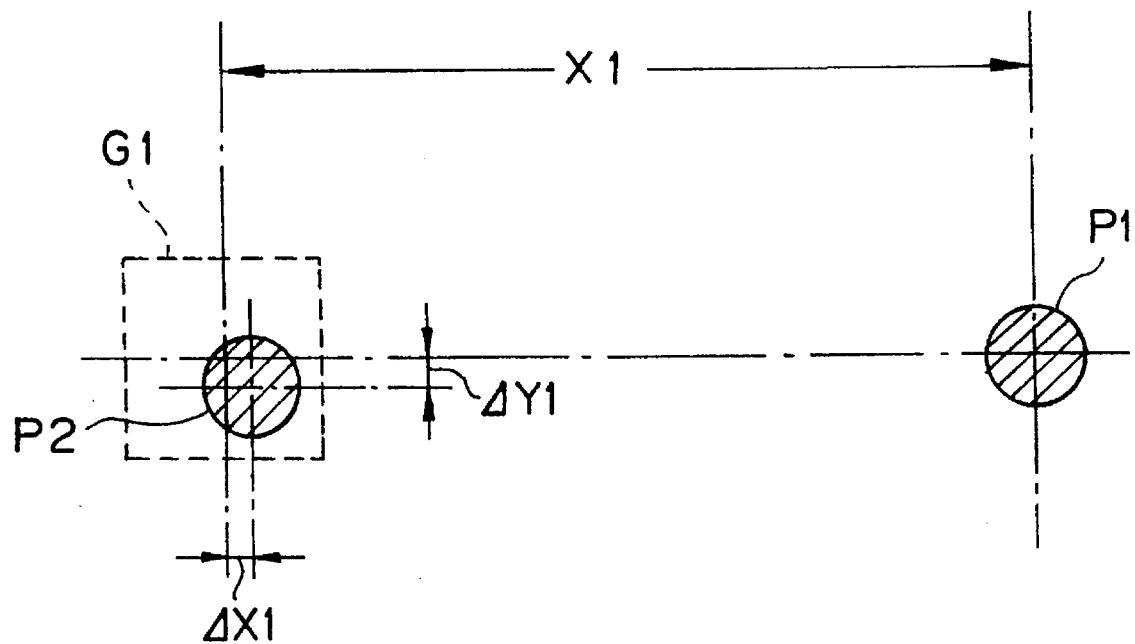
FIG. 4 is a diagram illustrating a situation of a nozzle misalignment measurement in the embodiment shown in FIG. 1.

Referring then to FIG. 4, assuming that the application point in the case where there is no misalignment of the nozzle 1 with respect to the dummy substrate is P1 and the field of view of the image recognition camera 11a is G1, the distance X1 between the center of the application point P1 (the center of the dot-like paste film) and the center of the field of view G1 of the image recognition camera 11a corresponds to the distance through which the dummy substrate has been moved by the servo motor 15b. Then, the microcomputer 14a drives the moving mechanism so that the application point P1 on the dummy substrate is moved back to the field of view G1 of the image recognition camera 11a by the known distance X1. In a situation where there is no misalignment of the nozzle 1, the application point P1 coincides with the center of the field of view G1 after the backward movement by the distance X1. If there is a misalignment of the nozzle 1, the center of the field of view G1 and the application point do not coincide with each other after he backward movement by the distance X1. Assuming that the application point moved by this backward movement is P2, deviations ΔX1 and ΔY1 of the center of the application point P2 from the center of the field of view G1 of the image recognition camera 11a are calculated (step 409), and are stored as data representing a misalignment or offset of the nozzle 1 in the RAM of the microcomputer 14a. Then, the operation of attracting the dummy substrate is stopped (step 414).

The sub process of step 400 shown in FIG. 5 is thus performed.

Referring back to FIG. 5, if the paste container cylinder 2 has not been changed, or when the process of step 400 is finished, the substrate on which paste patterns having desired shapes are to be drawn by applying the paste is placed, attracted to and supported on the attracting base 13 (FIG. 1) (step 500), and preliminary substrate positioning is performed (step 600). A sub process for this positioning will be described with reference to FIG. 8.

Figure 8:
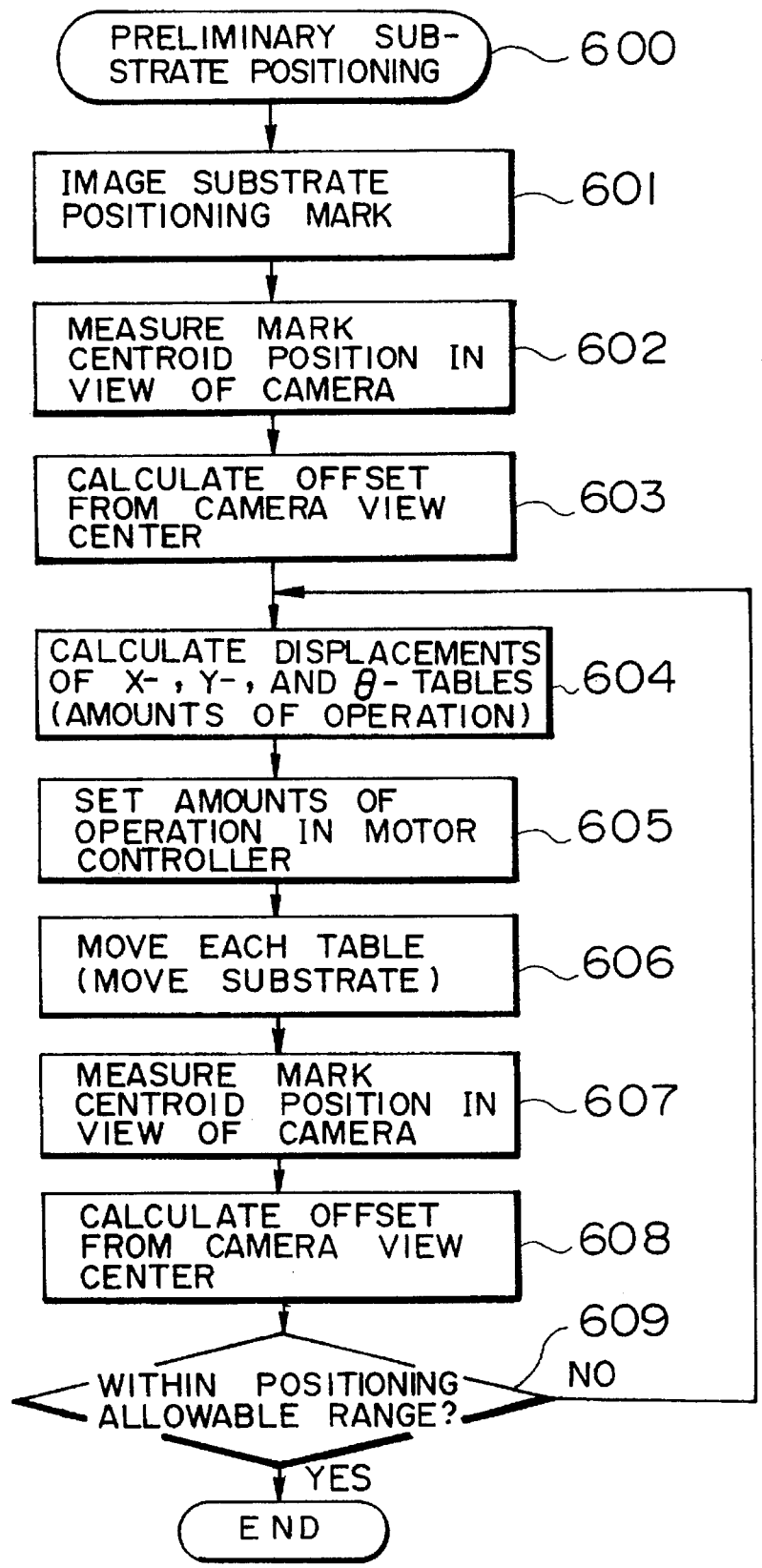
FIG. 8 is a flowchart showing details of a preliminary substrate positioning step shown in FIG. 5.

Referring to FIG. 8, a positioning mark previously formed on the substrate 7 (FIG. 1) mounted on the attracting base 13 is first imaged by the image recognition camera 11a (step 601). The centroid position of this positioning mark in the field of view G1 of the image recognition camera 11a (FIG. 4) is obtained by image processing (step 602). Values of a misalignment or offset of the centroid position of the positioning mark from the center of the field of view G1 are calculated (step 603), and the amounts of movement or displacement of the X-axis table 5, the Y-axis table 6 and the θ-axis table 8 (FIG. 1) for setting the substrate 7 to a desired position are calculated by using the misalignment values (step 604). Further, the amounts of movement thus calculated are converted into amounts of operation of the servo motors 15b to 15d (step 605), and the servo motors 15b to 15d are driven in accordance with the amounts of operation thereby obtained. The tables 5, 6 and 8 are thereby moved so that the substrate 7 is set at the desired position (step 606).

Thereafter, in order to confirm whether the substrate 7 has been moved to the desired position, the positioning mark on the substrate 7 is again imaged by the image recognition camera 11a to measure the center (centroid) of the positioning mark in the field of view G1 (step 607), and misalignment or offset values of the mark center in the field of view G1 are obtained (step 608). A determination is made as to whether the misalignment values are within the allowable ranges (ΔX, ΔY) described above with reference to FIG. 2 (step 609). If the misalignment values fall within the allowable ranges (ΔX, ΔY), it is considered that the process of step 600 has been completed. If the misalignment values fall outside the allowable ranges, the process returns to the step 604 to repeat the above-described processing.

Referring again to FIG. 5, when the sub process of step 600 is completed, the main process advances to a paste film forming process (processing) of step 700. This sub process will be described with reference to FIG. 9.

Figure 9:
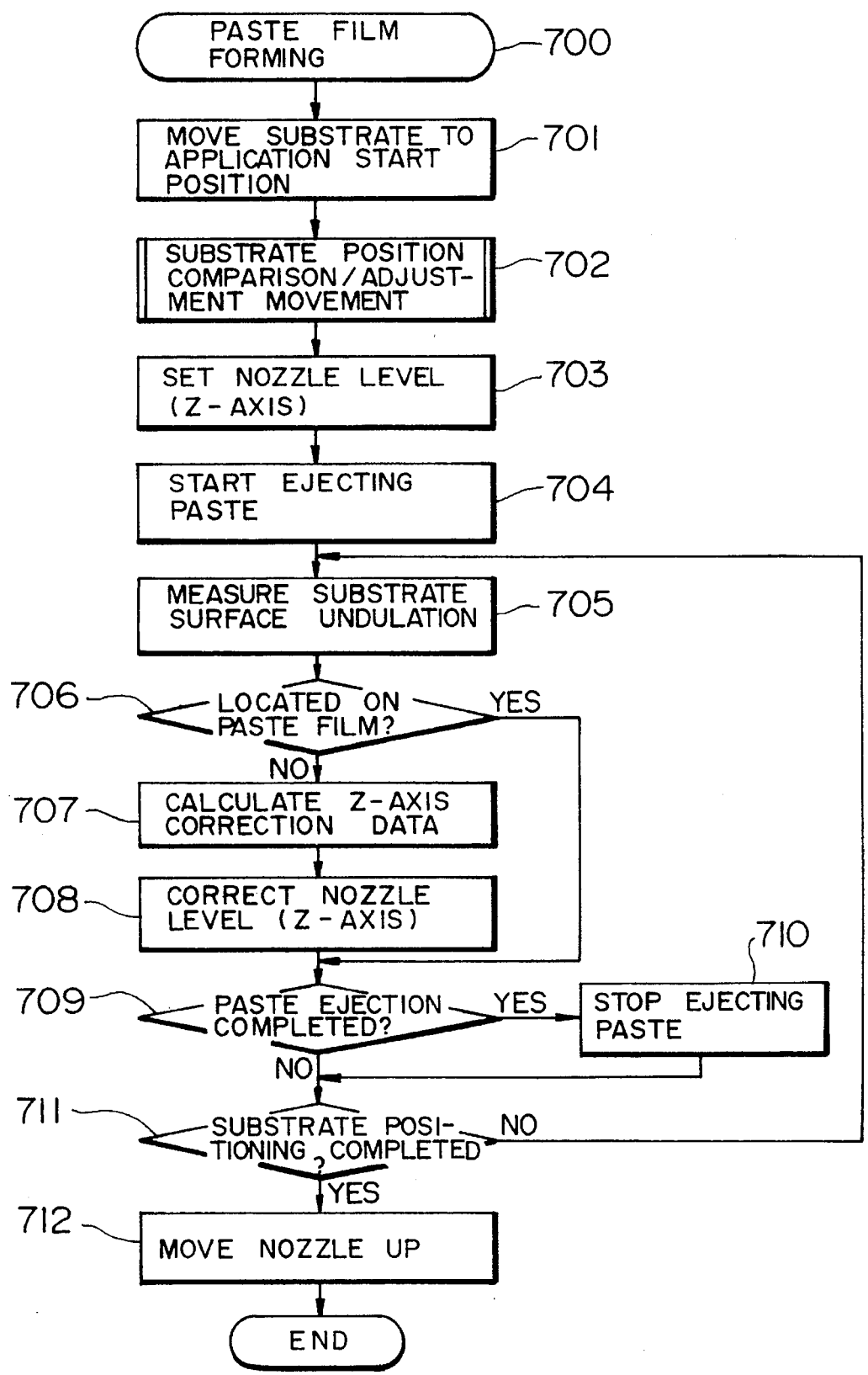
FIG. 9 is a flowchart showing details of a paste film forming step shown in FIG. 5.

Referring to FIG. 9, the substrate 7 is first moved to the application start position (step 701), and a sub process of moving the substrate 7 for comparison/ adjustment operation (step 702) is performed. This sub process is based on the nozzle misalignment measurement sub process of step 400 described above with reference to FIG. 7 and will be described with reference to FIG. 10.

Figure 10:
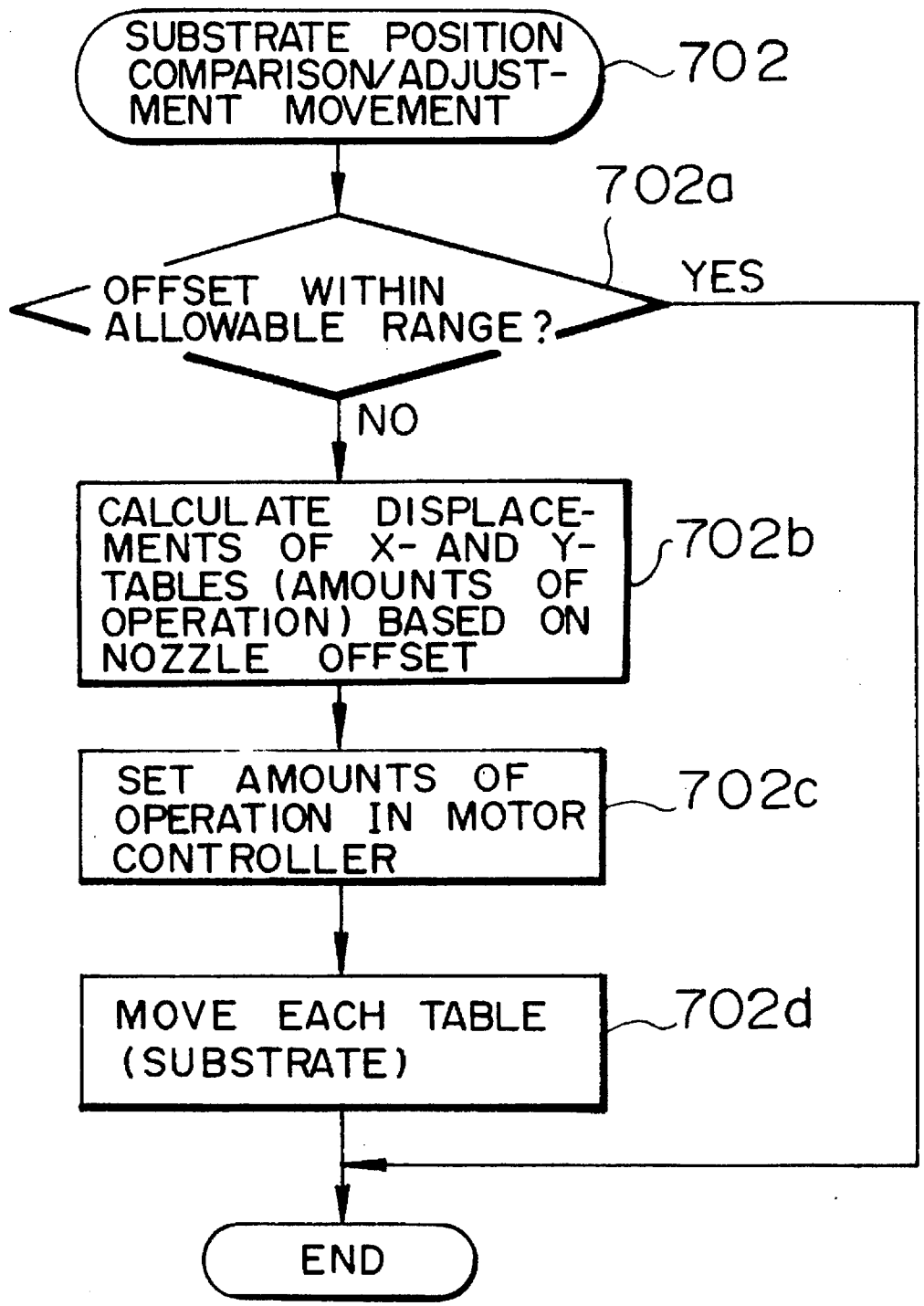
FIG. 10 is a flowchart showing details of a substrate position comparison/adjustment movement step shown in FIG. 9.

Referring to FIG. 10, a determination is first made as to whether the values ΔX1 and ΔY1 of the misalignment of the nozzle 1 obtained in step 409 shown in FIG. 7 and stored in the RAM of the microcomputer 14a (FIG. 3) fall within the allowable misalignment ranges ΔX and ΔY of the nozzle 1 described above with reference to FIG. 2 (step 702a). If the alignment values are within these allowable ranges (ΔX≧ΔX1, ΔY≧ΔY1), the process advances directly to step 703 shown in FIG. 9. If the alignment values are out of the allowable ranges (ΔX<ΔX1, ΔY<ΔY1), the amounts of movement of the X-axis table 5 and the Y-axis table 6 for moving the substrate 7 are calculated from the misalignment values ΔX1 and ΔY1 previously obtained (step 702b), and amounts of operation are set in the motor controller 14b (FIG. 4) on the basis of these amounts of movement (step 702c). Then, the servo motors 15b and 15c are rotated in accordance with the set amounts by the X-axis driver 14cb and the Y-axis driver 14cc, thereby moving the X-axis table 5 and the Y-axis table 6. The misalignment or offset between the nozzle 1 and the desired application point on the substrate 7 due to the change of the paste container cylinder 2 is thereby canceled, that is, the substrate 7 is positioned so that the desired application point at which application of the paste to the substrate 7 is to be started is located just under the ejection orifice of the nozzle 1. This processing is thus completed.

Thereafter, the process proceeds to step 703 to set the level elevation of the nozzle 1. That is, the level of the nozzle 1 is adjusted so that the distance between the ejection orifice of the nozzle 1 and the substrate 7 becomes equal to the thickness of a paste film to be formed. Since the substrate 7 has been located at the desired position by the substrate preliminary positioning (step 600 of FIG. 8) and substrate position comparison/adjustment processing (step 702 of FIG. 10), the process advances to step 704 to start ejecting the paste.

Then, actually-measured data on the distance between the ejection orifice of the nozzle 1 and the substrate 7 obtained by the optical distance measuring device 3 is input to measure undulations in the surface of the substrate (step 705), and a determination is made from the actually-measured data from the optical distance measuring device 3 as to whether the measuring point of the optical distance measuring device 3 is on the paste film (step 706). This determination is made on the basis of information on whether the actual data from the optical distance measuring device 3 is changed extremely largely by a movement of the measuring point across the paste film, information on whether an allowable value is exceeded by an undulation, and other information. If it is determined that the measuring point of the optical distance measuring device 3 is not on the paste film, correction data for moving the Z-axis table is calculated on the basis of the actually measured data (step 707). The level of the nozzle 1 is corrected by using the Z-axis table 4a to maintain the position of the nozzle 1 along Z-axis at a set value (step 708). On the other hand, if it is determined that the measuring point of the optical distance measuring device 3 is moving across the paste film, the level of the nozzle 1 is maintained at the value before the determination while the paste is continuously ejected (step 706). Ordinarily, the change in an undulation of the substrate 7 is ordinarily very small during passage of the measuring point across a paste film portion of a small thickness. In such a case, the ejected shape of the paste may be constantly maintained if the level of the nozzle 1 is not changed. In this manner, the paste film can be formed to have the desired thickness.

The process advances from step 706 or 708 to step 709 to determine whether a set pattern forming operation has been completed. If it has been completed, the ejection of the paste is terminated (step 710). If the set pattern forming operation has not been completed, the ejection of the paste is continued. The completion of this operation is determined when a terminal point of the pattern continuously drawn by this operation is reached. It is not always necessarily that such a terminal point corresponds to the actual terminal point of each pattern. A determination as to whether the terminal point of each pattern is reached is made in step 711. If the end of the operation corresponds to an intermediate point, the process returns to the substrate surface undulation measurement processing (step 705) to repeat the described steps. When the measuring point deviates from the paste film, the process returns to the nozzle elevation correction steps (steps 707 and 708).

When the paste film formation is continued in this manner until the terminal end of each pattern is reached (step 711), the Z-axis table 4a is driven to lift the nozzle 1 (step 712) and the paste film formation (step 700) is terminated.

Referring to FIG. 5, when the step 700 is completed, the substrate 7 on which paste drawing has been completed is removed from the attracting base 13 (step 800) and a determination is made as to whether the above-described overall process is to be stopped (step 900). That is, in a case where paste films having the same patterns are formed on a plurality of substrates 7, the process returns to the cylinder change determination step (step 300), and the sequence from this step to the substrate discharge step (step 800) is repeated. The overall process is terminated when no unprocessed substrate 7 is left.

In the stop determination step (step 900), a determination is made as to whether the amount of the paste remaining in the paste container cylinder 2 is sufficient by a user's confirming operation or by an operation of the microcomputer 14a based on the amount of the paste accumulated after a container cylinder change. If the remaining amount is insufficient, the paste container cylinder 2 is changed. The arrangement may be such that the fact of this change is input through the keyboard 17 and stored as a flag in the RAM of the microcomputer 14a, and the existence or non-existence of such a flag in a data table in the RAM relating to the paste container cylinder change is confirmed when the process returns to the cylinder change determination step (step 300), thereby enabling deviations to be obtained automatically in the next nozzle misalignment measuring process (step 400).

If the flag in the data table in the RAM of the microcomputer 14a relating to the paste container cylinder change is confirmed and if deviations are automatically obtained in the next nozzle misalignment measuring process (step 400), the flag in the data table relating to the paste container cylinder change is erased to prevent re-execution of the nozzle misalignment measuring process (step 400) with the flag.

It is possible that the paste in the paste container cylinder 2 will be used up during the paste film forming process (step 700) described above with reference to FIG. 9. If the substrate 7 being processed is such that the application drawing can be continued without advancing the process to the substrate removal step (step 800) or replacing the substrate when the paste container cylinder 2 is changed in such a situation, the cylinder change determination step (step 300) and the nozzle misalignment measuring step (step 400) shown in FIG. 5 may be performed before the paste film forming process (step 700) is restarted.

In the above-described embodiment, the substrate 7 is moved along X-and Y-axes relative to the paste container cylinder 2. However, the arrangement may alternatively be such that the substrate 7 is fixed while the paste container cylinder 2 (accordingly, nozzle 1) is moved along X-and Y-axes.

To reduce the time taken for the application initialization process (step 200) of FIG. 5, the apparatus may be modified such that a memory reader for reading an external memory means such as an IC card, a floppy disk or a hard disk is connected to the external interface 14e (FIG. 3), setting of various kinds of data for the application initialization process (step 200) of FIG. 5 is executed in advance by a personal computer or the like, and the data are transferred from the external memory means to the RAM in the microcomputer 14a shown in FIG. 3 through the memory reader connected to the external interface 14e when the application initialization process (step 200) is performed.

In the above-described embodiment, the substrate 7 is moved along X-and Y-axes relative to the image recognition camera 11a to obtain nozzle position misalignment or offset values (ΔX, ΔY). Alternatively, the image recognition camera 11a may be moved, as described below.

Figure 11:
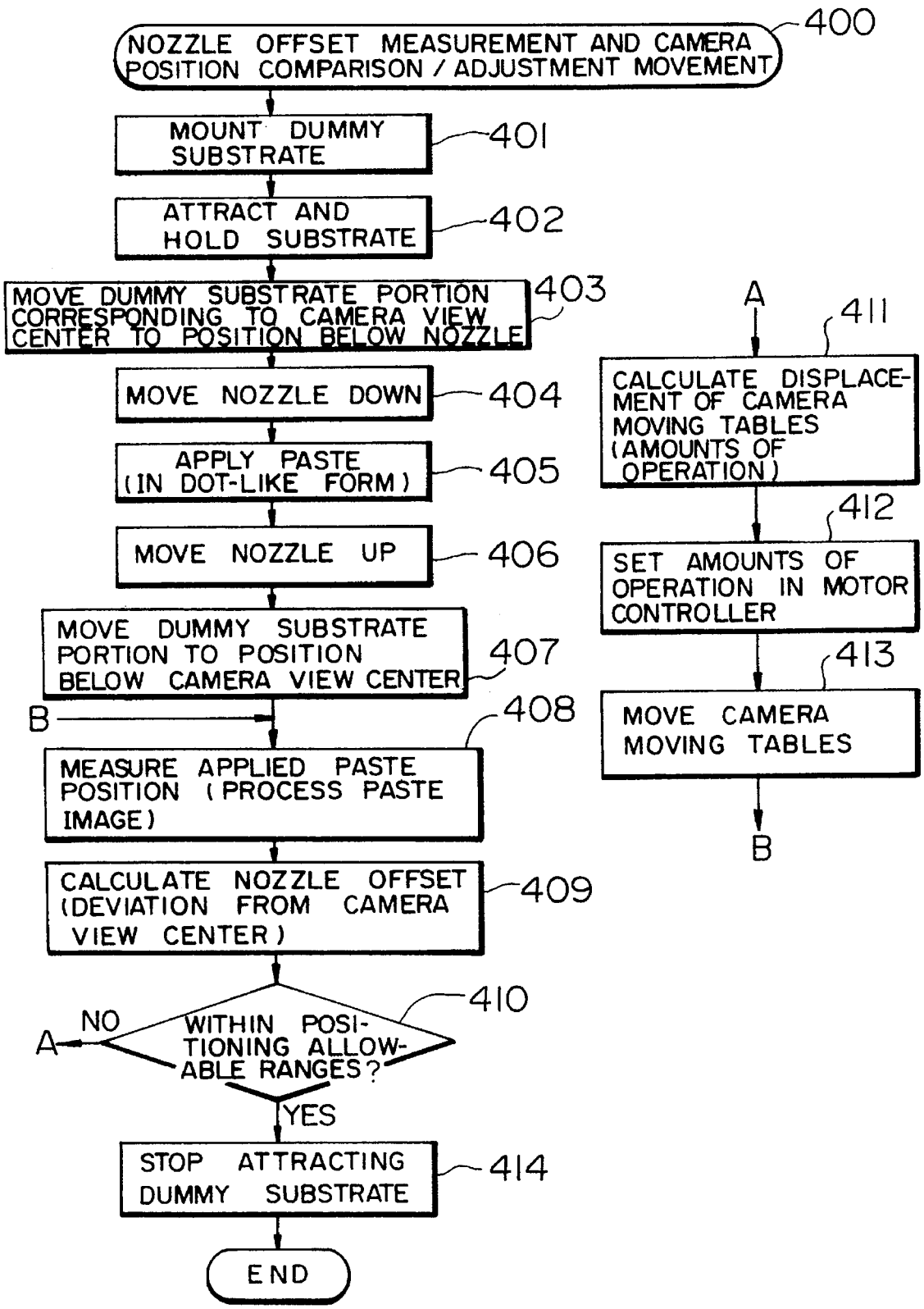
FIG. 11 is a flowchart showing details of another example of the nozzle misalignment measuring step, i.e., a nozzle misalignment measurement and camera position comparison/adjustment movement step.

That is, if the paste container cylinder 2 is changed in the process shown in FIG. 5, a sub process of a nozzle misalignment measurement and an operation of moving the camera position for comparison and adjustment (step 400), shown in FIG. 11, are performed. The flow from step 401 (mounting a dummy substrate) to step 409 (calculating a nozzle offset) shown in FIG. 11 is the same as the corresponding flow shown in FIG. 7 and, therefore, will not particularly be described.

Referring to FIG. 11, a determination is made (step 410) as to whether nozzle misalignment values ΔX1 and ΔY1 stored in the RAM in step 409 are within the ranges (ΔX/2, ΔY/2) which are ½ the misalignment allowable ranges of the nozzle 1 mentioned above with respect to the process shown in FIG. 2. If the misalignment values are within these ranges (ΔX/2≧ΔX1 and ΔY/2≧ΔY1), it is determined that there is no misalignment of the nozzle 1 and the operation of attracting the dummy substrate is stopped (step 414).

It has been described that the allowable values of the deviations ΔX1 and ΔY1 of the application point P2 of the nozzle from the positioning reference point of the image recognition camera 11a, which occur in the nozzle misalignment measurement and camera position comparison/adjustment movement step (step 400), are equal to allowable values of deviations ΔX2 and ΔY2 of the positioning mark centroid position from the positioning reference point of the image recognition camera 11a, which occur in the preliminary substrate positioning process (step 600), that is, ΔX1=ΔX2=ΔX/2, ΔY1=ΔY2=ΔY/2. These values, however, may be variously selected so as to satisfy ΔX≧ΔX1+ΔX2, ΔY≧ΔY1+ΔY2 by considering the control accuracy of the substrate positioning X-axis and Y-axis tables 5 and 6, the control accuracy of the camera moving X-axis and Y-axis tables 18 and 19 for positioning the image recognition camera 11a and other factors.

Also, in the described embodiment, the positioning reference point of the image recognition camera 11a coincides with the center of the field of view of the camera 11a. However, the positioning reference point may be set to any point within the field of view of the image recognition camera 11a other than the center thereof.

If the nozzle misalignment values AΔX1 and ΔY1 are out of the above-mentioned ranges (ΔX/2<ΔX1, ΔY/2<ΔY1), the amounts of movement of the camera moving X-axis table 18 and the camera moving ΔY-axis table 19 corresponding to the misalignment values ΔX1 and ΔY1 previously obtained are calculated (step 411), and amounts of operation are set in the motor controller 14b (FIG. 3) on the basis of the amounts of movement calculated (step 412). The motor controller 14b drives the servo motors 15e and 15f through the camera moving X-axis driver 14ce and the camera moving Y-axis driver 14cf to rotate these motors in accordance with the set amounts of operation, thereby moving the camera moving X-axis table 18 and the camera moving Y-axis table 19. The image recognition camera 11a is thereby moved so that the center of its field of view moves toward the center of the application point P2 (step 413).

During this movement, the process returns again to step 408, the center of the application point P2 is determined (step 408), and deviations ΔX1 and ΔY1 of the center of the application point P2 from the center of the field of view G1 of the image recognition camera 11a are newly obtained (step 409), thereafter performing the above-described operations. The sequence of operations of steps 408 to 413 is repeated until the values ΔX1 and ΔY1 of the misalignment of the nozzle 1 fall within the ranges of the above-mentioned values (ΔX/2, ΔY/2).

When the misalignment values of the nozzle 1 fall within the positioning allowable ranges, the operation of attracting the dummy substrate is stopped (step 414) and the substrate 7 is then mounted (step 500).

As described above, the values (ΔX1, ΔY1) of a misalignment of the nozzle 1 may be corrected by moving the image recognition camera 11a instead of moving the substrate 7.

In the above-described embodiment, the substrate and the image recognition camera are moved along X-and ΔY-axes while the nozzle is moved along Z-axis alone. However, a drive mechanism may also be provided to move the nozzle Z-axis table along each of X-and Y-axes.

What is claimed is:

1. An apparatus for applying a paste to a substrate, comprising:

a table for holding the substrate;

a paste container for containing the paste;

a mount for mounting said paste container thereon;

a nozzle which is in fluid-flow communication with said paste container and which has a paste ejection orifice facing an upper surface of said table holding the substrate, said nozzle being attached to said paste container;

means for changing the positions of said nozzle and said table relative to each other while said nozzle applies the paste to an upper surface of the substrate to thereby form thereon a paste pattern of a desired shape;

measurement means for measuring the position of the paste ejection orifice of said nozzle when said nozzle has been exchanged together with said paste container to which said nozzle is attached, in the course of forming the paste pattern, for a new nozzle attached to a new paste container associated therewith;

calculation means for calculating a misalignment of the paste ejection orifice of said new nozzle based on a result of the measurement made by said measurement means; and adjustment means for adjusting the position of the substrate according to the misalignment calculated by said calculation means, whereby the misalignment of the position of the paste ejection orifice after said nozzle has been exchanged can be corrected.

2. An apparatus according to claim 1, further comprising:

memory means for storing, when said nozzle has been exchanged, information indicating that said nozzle has been exchanged; and reading means for reading said information from said memory means prior to the formation of the same paste pattern.

3. An apparatus according to claim 2, wherein said reading means reads said information from said memory means, and said measurement means, said calculation means and said adjustment means can operate to correct a misalignment of said nozzle after said nozzle has been exchanged.

4. An apparatus according to claim 1, further comprising an image recognition camera provided above the upper surface of said table holding the substrate, wherein said measurement means forms a dot-like paste film on a portion of the substrate by said nozzle, moves said portion of the substrate to a position under a center of the field of view of said image recognition camera, images the dot-like paste film by said image recognition camera, processes an image output from said image recognition camera by an image processing means to obtain the position of a center of said dot-like paste film, and measures the position of the paste ejection orifice of said nozzle based on the amount of movement of the substrate and the thus obtained position of the center of the paste film.

5. An apparatus according to claim 4, wherein said calculation means calculates a misalignment of the paste ejection orifice of said new nozzle by calculating deviations of the position of the center of the dot-like paste obtained by said measurement means and an application point under said paste ejection orifice from the center of the field of view of the image recognition camera.

6. An apparatus for applying a paste to a substrate, comprising:

a table for holding the substrate;

a paste container for containing the paste;

a mount for mounting said paste container thereon;

a nozzle which is in fluid-flow communication with said paste container and which has a paste ejection orifice facing an upper surface of said table holding the substrate, said nozzle being attached to said paste container;

means for changing the positions of said nozzle and said table relative to each other while said nozzle applies the paste to an upper surface of the substrate to thereby form thereon a paste pattern of a desired shape;

measurement mean for measuring the position of the paste ejection orifice of said nozzle when said nozzle has been exchanged together with said paste container to which said nozzle is attached, in the course of forming the paste pattern, for a new nozzle attached to a new paste container associated therewith;

calculation means for calculating a misalignment of the paste ejection orifice of said new nozzle based on a result of the measurement made by said measurement means;

a substrate positioning camera; and adjustment means for adjusting the position of said substrate positioning camera according to the misalignment calculated by said calculation means to set the paste ejection orifice of said nozzle and the substrate positioning camera in a predetermined positional relationship, whereby the misalignment of the position of said paste ejection orifice of said nozzle after said nozzle has been exchanged can be corrected.

7. An apparatus according to claim 6, further comprising:

memory means for storing information indicating that said nozzle has been exchanged; and reading means for reading said information from said memory means before a paste pattern is drawn on the substrate.

8. An apparatus according to claim 7, wherein said reading means reads said information from said memory means and actuates said measurement means, said calculation means and said adjustment means to correct a misalignment of said nozzle after said nozzle has been exchanged.

9. An apparatus according to claim 6, further comprising an image recognition camera provided above the upper surface of said table holding the substrate, wherein said measurement means moves a center of the field of view of the image recognition camera on said substrate to a position right under said nozzle, forms a dot-like paste film on said substrate, moves the substrate to a position under the center of the field of view of said image recognition camera, images the dot-like paste film by said image recognition camera, processes an image output from said image recognition camera by an image processor to obtain the position of a center of the dot-like paste film, and measures the position of the paste ejection orifice of said nozzle based on the amount of movement of the substrate and the thus obtained position of the center of the paste film.

10. An apparatus according to claim 6, wherein said calculation means calculates a misalignment of the paste ejection orifice of said new nozzle by calculating a deviation of the position of the center of a paste application point of said nozzle measured by said measurement means from the center of the field of view of said image recognition camera.

* * * * *